March 26, 1963 C. HEPNER 3,082,520

AUTOMATIC SOLDERING MACHINE AND METHOD

Original Filed Jan. 26, 1956 4 Sheets-Sheet 1

INVENTOR.
Charles Hepner
BY Mueller & Aichele
Attys.

March 26, 1963 C. HEPNER 3,082,520

AUTOMATIC SOLDERING MACHINE AND METHOD

Original Filed Jan. 26, 1956 4 Sheets-Sheet 2

INVENTOR.
Charles Hepner
BY
Mueller & Aichele
Attys.

March 26, 1963 C. HEPNER 3,082,520

AUTOMATIC SOLDERING MACHINE AND METHOD

Original Filed Jan. 26, 1956 4 Sheets-Sheet 3

INVENTOR.

Charles Hepner

BY

Mueller & Aichele

Attys.

AUTOMATIC SOLDERING MACHINE AND METHOD

Original Filed Jan. 26, 1956 4 Sheets-Sheet 4

INVENTOR.
Charles Hepner
BY
Mueller & Aichele
Attys.

United States Patent Office 3,082,520
Patented Mar. 26, 1963

3,082,520

AUTOMATIC SOLDERING MACHINE AND METHOD

Charles Hepner, Chicago, Ill., assignor to Motorola, Inc., Chicago, Ill., a corporation of Illinois
Continuation of application Ser. No. 561,427, Jan. 26, 1956. This application Mar. 12, 1958, Ser. No. 720,983
7 Claims. (Cl. 29—471.1)

The present invention relates to automatic soldering machines, and more particularly to an improved automatic soldering machine for soldering the contacts of electrical and electronic components to corresponding printed circuit panel assemblies adapted to support and interconnect such components.

This application is a continuation of copending application Serial No. 561,427 filed January 26, 1956, now abandoned.

Until recent years most electronic apparatus was mounted on rigid metal chassis, with the contacts of the electrical components therein being connected together by wire leads or jumpers. These leads were usually manually hooked and crimped to the contacts of the components; and the connections were then soldered, which was also carried out manually. Such a fabricating process is clearly costly, since, among other things, it involves a relatively large number of skilled and semi-skilled manual operations.

In order to streamline and reduce costs in the manufacturing of electronic equipment, printed circuit methods and techniques have come into greater and greater prominence in recent years. These circuits consist generally of electrical conductors formed on one or both surfaces of a thin molded phenolic laminate panel, or other type of insulating panel, this being done by any one of a multiplicity of printing or plating processes known to the art today. For example, a large number of successful plated circuit assemblies have been made commercially by the process described and claimed in Nieter Patent 2,699,425 which issued January 11, 1955, and which is assigned to the assignee of the present application.

Printed circuit assemblies, such as those fabricated by the process described in the Nieter patent referred to above, are equipped with interconnected metallized eyelets extending through the panel and these eyelets receive the connection of the various electronic components supported on the panel. Subsequent soldering of these connections to the eyelets secures the components to the panel, and establishes electrical connection between the components by means of the conductors imprinted or plated on the surfaces of the panel.

Many expedients have been suggested in the past for providing quick and efficient soldering of the above mentioned connections into the eyelets or into equivalent terminals on the printed circuit panel or board. The most usual of these soldering methods has been the technique known generally as "dip soldering." However, dip soldering in general is subject to several limitations. For example, it is difficult to provide a simple, mechanical carriage or conveyor for the panels because straight-line motion is not compatible with dip soldering. Instead, the panels must usually be moved successfully in a horizontal direction, and then individually moved vertically to dip them in to the molten solder. Also there is a problem in dip soldering apparatus of eliminating the scum that forms on the surface of the molten solder in the crucible, and many elaborate systems have been tried out in an attempt to maintain the solder surface free from such scum. Another problem is one of heat, the temperature of the molten solder being sufficiently high so that damage to the printed circuit panels often results unless unduly expensive panels are used having high heat resistance.

It is, accordingly, an object of the present invention to provide an improved automatic soldering machine for the purposes described above and in which the above enumerated problems of the prior art are successfully overcome and solved.

A more general object of the invention is to provide an improved automatic soldering machine for effecting solder joints on printed or plated circuit panel assemblies.

Another object of the invention is to provide an improved and relatively inexpensive automatic soldering machine for printed or plated circuit panel assemblies which is capable of imparting extremely clean, scum free solder connections to the assembly and at a relatively low temperature so that there is no need to use unduly expensive panels for the printed circuit boards.

Yet another object of the invention is to provide such an improved soldering machine for plated or printed circuit panel assembly which provides efficient and essentially continuous soldering to a succession of such assemblies in a simple and rapid manner and with the assemblies being drawn across the solder station along a "straight line" uniplanar path.

A feature of the invention is the provision of an automatic soldering machine which includes a crucible for molten solder, and means (such as a submerged rotating "paddle wheel") for producing a "hump" on the surface of the solder in the crucible. The production of such a hump allows the panels to be drawn in a straight line path over the surface of the molten solder in spaced parallel relation therewith, with each panel passing across the hump in contact therewith. This expedient not only enables the panels to be drawn along a simple uniplanar path, but also causes only a small portion of the panel to be contacted by the molten solder at any one time which reduces heating of the panel to a minimum.

Another feature of the invention is the provision in such a soldering machine of a rotatable member within the crucible for producing the hump described above, which member is constructed to cause the hump to be formed by pure molten solder drawn from below the surface of the molten solder mass so that the successive panels may be contacted by pure scum-free solder.

The above and other features of the invention which are believed to be new are set forth with particularity in the appended claims. The invention itself, however, together with further objects and advantages thereof, may best be understood by reference to the following description when taken in conjunction with the accompanying drawings in which:

The invention provides an automatic soldering machine which comprises a crucible for housing a quantity of molten solder. A rotatable member is adapted to be submerged in the molten solder in the crucible, and this member includes a series of angularly spaced axially extending blades arranged around the axis of rotation of the member and with their transverse axes extending essentially radially with respect to such axis of rotation.

Upon rotation of this member, the blades create a flow of molten solder from the interior of the member and through the radial spaces between the blades so as to create a hump of molten solder extending across the surface of the molten solder in the crucible essentially parallel to the axis of rotation of the member. The height of this hump is a function of the rotational speed of the rotatable member, and this height can be conveniently adjusted merely by adjusting such rotational speed. Driving means is provided for imparting rotational motion to the rotatable member, and the rotational speed of this driving means is conveniently adjustable for the purposes described above. A suitable guide extends over the crucible and across the hump in the molten solder therein, and this guide supports a series of printed circuit panels in spaced parallel relation with the surface of the molten solder in the crucible. Means is then provided for moving the series of printed circuit panels in succession along the guide means with the undersides of the panels being adapted to be drawn across the hump of molten solder and in contact therewith.

Figure 1:
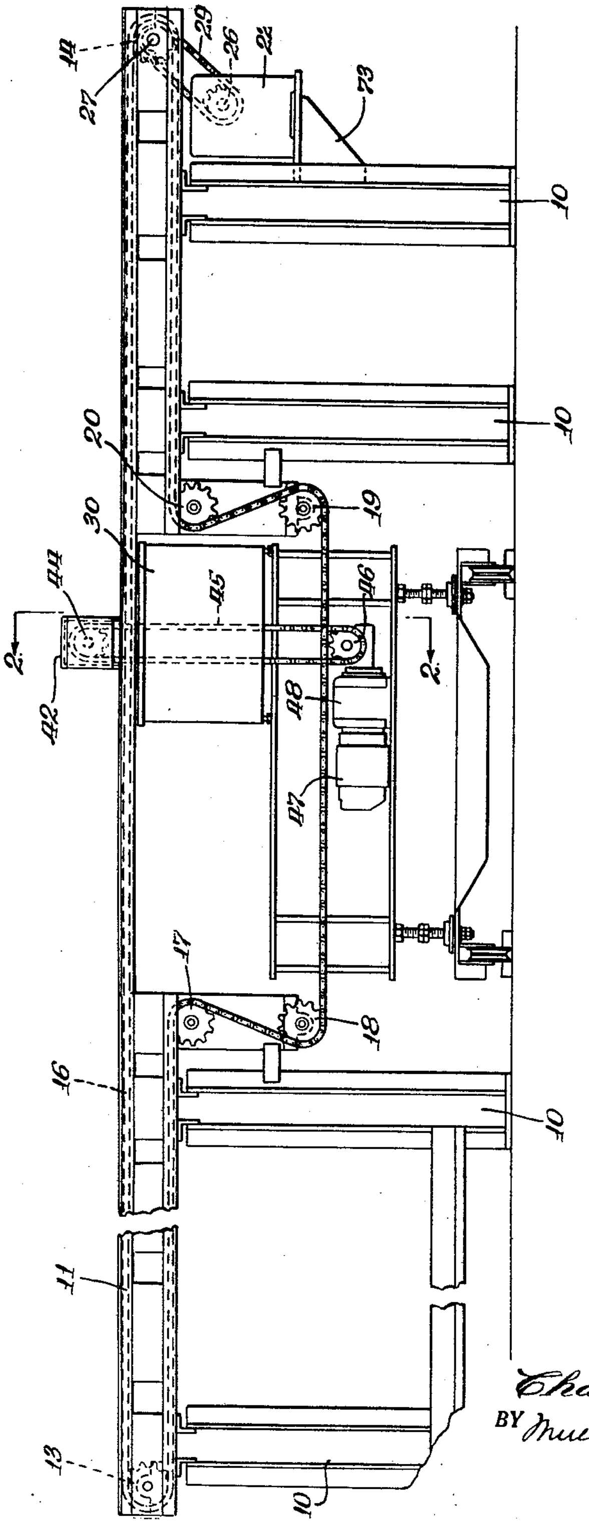
FIG. 1 is a side view of a machine constructed in accordance with the invention.
Figure 2:
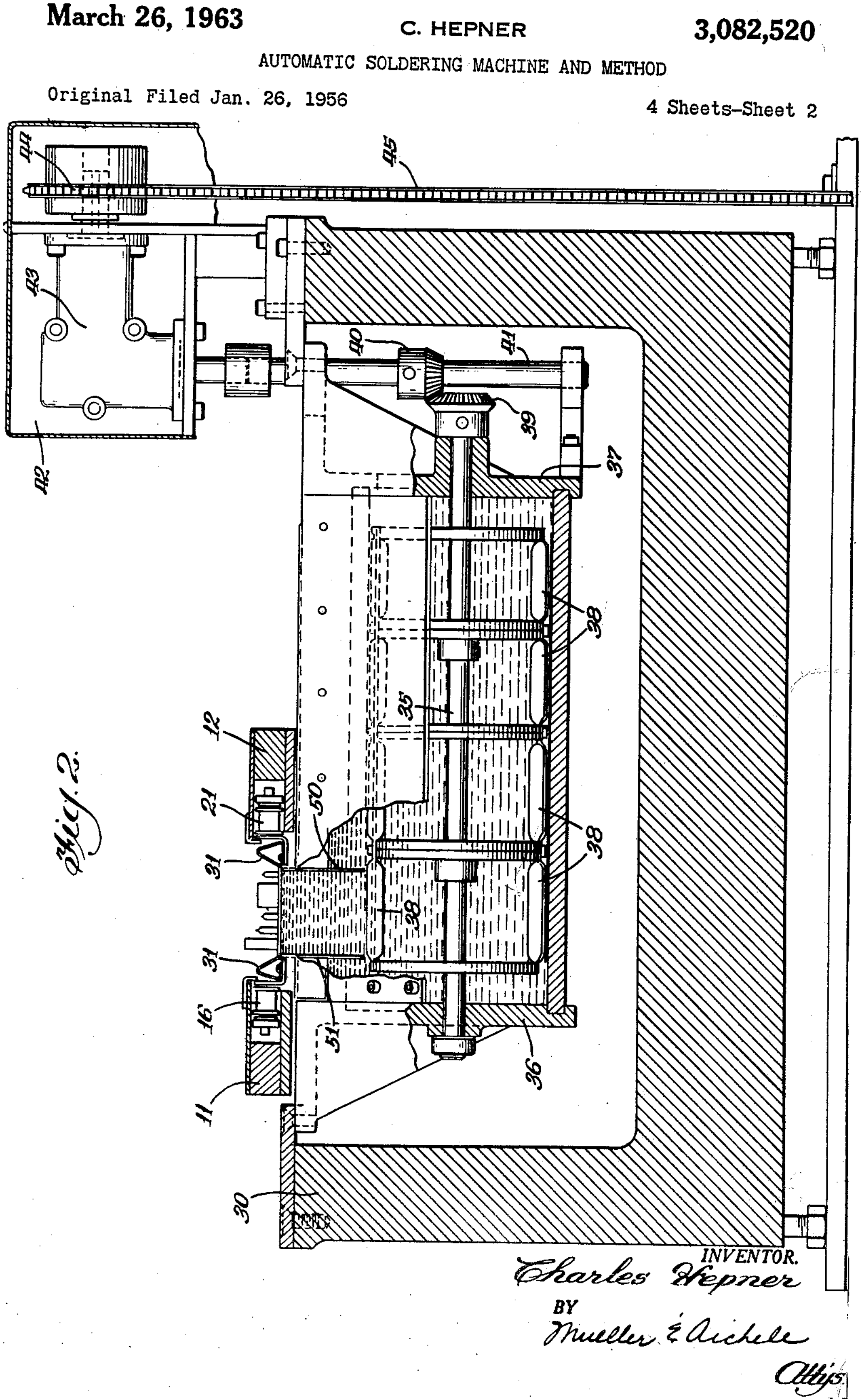
FIG. 2 is a sectional view of the machine taken along the lines 2—2 of FIG. 1.

Referring now in particular to FIGS. 1 and 2, the improved solder machine of the present invention includes a series of upright supporting members 10, which members are welded or otherwise secured to a pair of horizontal guides 11 and 12. A pair of sprockets such as sprocket 13 are rotatably mounted at one end of the horizontal guides 11 and 12, in spaced coaxial relation. A corresponding pair of sprockets 14 and 15 are rotatably mounted at the other end of the horizontal guides 11 and 12 and are also spaced in coaxial relation. An endless chain 16 is looped over sprockets 13 and 14 and over additional sprockets 17, 18, 19 and 20, which latter sprockets are rotatably mounted under the horizontal guides to support the chain on its return motion under the upper surface of the bracket 11 and clear it from a solder crucible which will be described. A similar chain 21 (FIGS. 2 and 3) is supported by sprocket 15 and other sprockets in respective spaced coaxial relation with sprockets 17–20 and the previously mentioned sprocket in spaced coaxial relation with sprocket 13. The two chains 16 and 21 form a conveyor system, and they are drawn in spaced parallel relation across the tops of the horizontal guides 11 and 12, and these chains are returned under these guides and held taut by sprockets 17–20 and the above-described additional sprockets which are in respective coaxial relation therewith.

Figure 3:
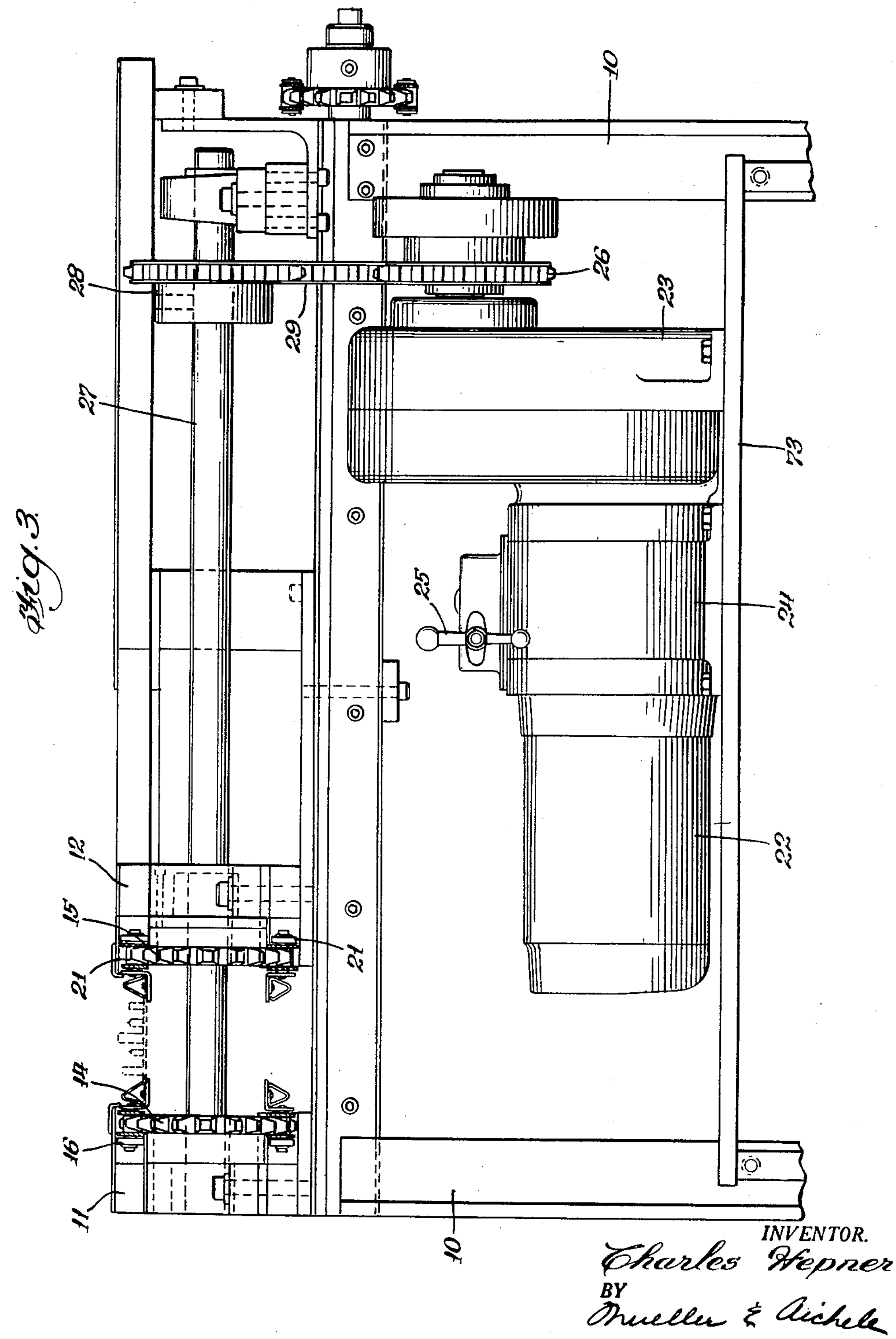
FIG. 3 is an end view of the machine taken from the right hand end of FIG. 1.

The conveyor system comprising the endless chains 16 and 21 is driven by a motor 22 which is supported on a bracket 73 at the right hand end of the machine. As best shown in FIG. 3, motor 22 is coupled to a speed-reducer 23 through a variable drive 24 which is manually controlled by means of a lever 25. A sprocket 26 is driven by the speed reducer and at a reduced speed as compared with the motor. Sprockets 14 and 15 are rigidly mounted on a shaft 27, which is rotatably mounted in the machine on suitable bearings and extends transverse to the direction of motion of chains 16 and 21. A sprocket 28 affixed to shaft 27 is coupled through a chain drive 29 to the sprocket 26 of speed reducer 23. In this manner, motor 22 causes the shaft 27 to rotate at a reduced speed which, in turn, drives the chains 16 and 21. The variable drive 24 on motor 22 provides a manual control for the speed of the spaced parallel chains 16 and 21 of the conveyor system.

The spaced parallel chains 16, 21 of the conveyor system pass over the top of a crucible or pot 30 (FIGS. 1 and 2) which is constructed to contain molten solder, and the solder pot incorporates suitable heating elements to maintain the solder therein in a molten condition. A series of resilient clips 31 (FIG. 2) are fastened to the chains at regular intervals and these clips are adapted to hold a series of printed circuit assemblies such as the one shown in FIG. 4 at spaced positions along the chain. As the chains pass over the top of the solder pot 30, the undersides of the successive panel, as shown in FIG. 5, are drawn across the solder pot in spaced parallel relation with the normal solder surface in the pot.

As shown particularly in FIG. 2, a rotatable shaft 35 is mounted on a pair of brackets 36 and 37 supported by the sides of the crucible, and this shaft is submerged below the normal level of molten solder in the solder pot. The shaft 35 is surrounded by a series of axial blades 38 which also are submerged below the surface of the solder. The blades 38 are positioned respectively around the axis of rotation of the rotatable shaft 35, and each of these blades extends in an axial direction with respect to the shaft. Moreover, the blades are angularly spaced with respect to one another and are arranged so that their respective transverse axes extend in a radial direction with respect to the shaft. With this arrangment, rotation of shaft 35 causes the blades to create a flow of molten solder from the inner space between them and the shaft, so as to force the solder from this inner space out through the radial spaces between the blades to form a hump extending across the surface of the molten solder in the solder pot in a direction essentially parallel to the axis of rotation of shaft 35. This creates a continuous solder flow and because the solder constituting this hump is drawn from below the surface of the solder in the solder pot, the hump is constituted by pure scum-free solder. Moreover, the height of the hump can be controlled merely by controlling the speed of rotation of the blades 38.

The shaft 35 is terminated in an angled gear 39 which engages a mating gear 40, the latter being fixed to a vertical shaft 41. Vertical shaft 41 is rotatably mounted in bracket 37 and extends out the top of the solder pot. The upper end of the shaft enters a housing 42 supported on one side of crucible 30, and in which housing a suitable transmission mechanism 43 is mounted which enables the vertical shaft to be driven by the horizontally mounted sprocket 44. Sprocket 44 is driven through a chain drive 45 from a sprocket 46, and the latter sprocket is driven by a motor 47 through a speed reducer 48. The motor 47 is equipped with a usual speed control (not shown) which, in turn, controls the speed of rotation 35 so that a convenient adjustment for the height of the hump in the solder can be effectuated.

A pair of parallel guide plates 50 and 51 (FIG. 2) extend into the solder hump, and these plates are in spaced parallel relation and arranged parallel to the direction of motion of the chains 16 and 21. The guide plates 50 and 51 extend into the molten solder approximately to the surface of the rotatable member comprised of blades 38, and the hump of molten solder created by the rotation of these blades causes the molten solder to rise between the guide plates 50 and 51 approximately to the respective upper edges of these plates. The horizontal guides 11 and 12 are arranged to form a guide means for the respective chains 16 and 21 so that these chains are guided over the top of the solder pot in such a manner that the panels supported thereby are drawn across the upper edges of plates 50 and 51 with their undersides successively contacted by the solder hump as it appears between these plates.

Figure 4:
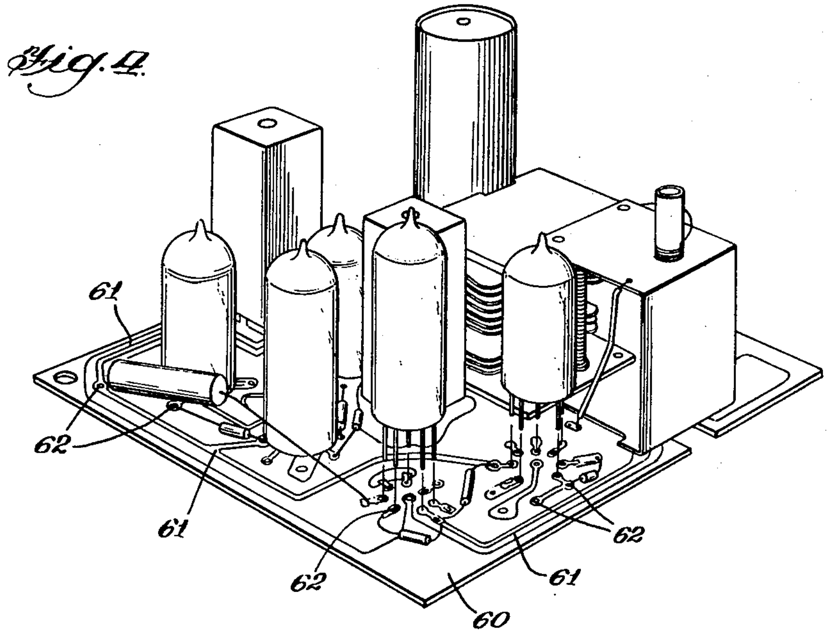
FIG. 4 shows a printed circuit panel with various components supported thereon to be mechanically affixed to the panel and electrically connected to the printed circuit by the soldering operation of the machine of the invention.
Figure 5:
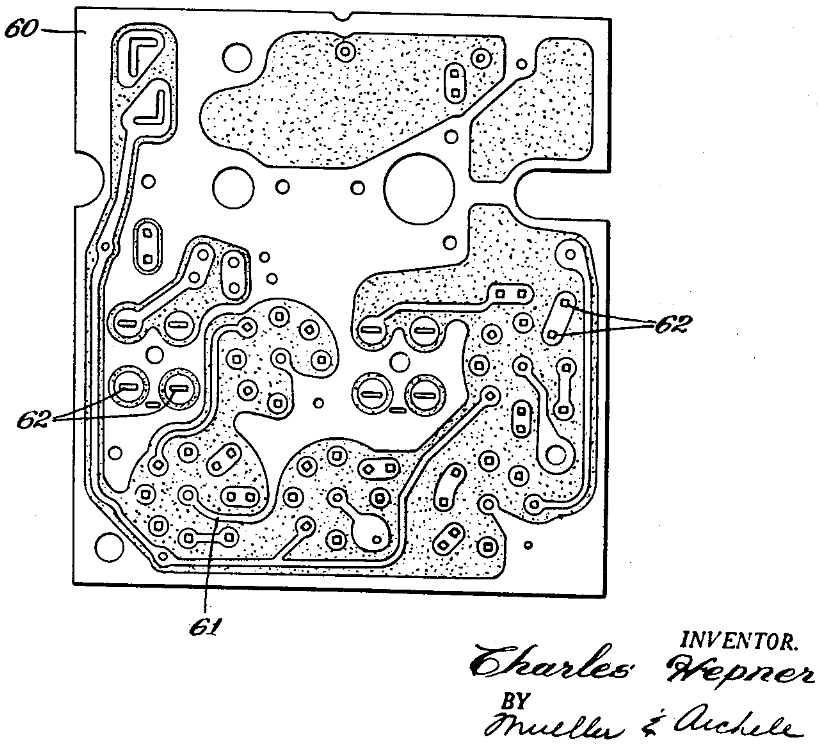
FIG. 5 is a view of the underside of the panel of FIG. 4.

As shown in FIG. 4, the printed circuit assembly includes a panel or base board which has electrical conductors 61 imprinted thereon by any suitable process. These conductors terminate in metallized eyelet 62 which extend through the panel and which receive the various contacts of the electronic and electrical components to be supported on the panel and to be electrically interconnected by the printed circuit. As the printed circuit is drawn across the solder pot, its underside, as shown in FIG. 5, is spaced and parallel to the surface of the solder in the pot. However, as each panel reaches the upper edges of guides 50 and 51, the underside of each panel is wiped across the humped portion of the solder surface which forms a solder joint for all the contacts and metallized terminals 62. As previously noted, a plurality of panels can be clipped onto the chains 16, 21 in a series to be successively drawn across the hump for mass-production soldering. As shown in FIG. 1, the panels may be loaded onto the conveyor system of chains 16, 21 at the left hand side of the machine, the components can be placed on the individual panels as they travel towards crucible 30, the assemblies may then be drawn through appropriate pre-heating and fluxing stations (not shown) just prior to being drawn over the top of the solder pot 30, and they are then drawn in succession across the hump. Then, the completed soldered assemblies can be unloaded at the right hand side of the machine.

The arrangement is such that straight line continuous motion can be used since there is no need to "dip" the panels down into the solder, instead, the solder is brought up to the undersides of the panels. It has been found that satisfactory soldering may be provided with the solder at a lower temperature than is required for satisfactory dip soldering. Moreover, since the panel is drawn across the hump, the entire undersurface is not contacted at once, and the heat used is diminished. This permits a cheaper grade of panel to be used. Also, the solder in the hump is drawn from the interior and is free of scum.

The invention provides, therefore, a simple and improved machine for providing automatic soldering for printed circuit assemblies, and which soldering is more rapid and yet improved as compared with the soldering achieved by prior art machines of this general type.

I claim:

1. A method of applying molten solder to solderable portions of a printed circuit assembly on a panel of insulating material wherein the solder contacts such portions in substantially touching contact as the printed circuit assembly is moved in an assembly line relative to the molten solder, including the steps of rotating mechanical means wholly submerged in a body of molten solder about a substantially horizontal axis in a molten solder container, which circulates a volume of molten solder and causes molten solder to flow from the mechanical circulating means into a controlled moving molten solder hump of a predetermined height above the solder in the container that is not a part of the hump, confining the hump to a predetermined width corresponding to the width of a printed circuit assembly to be soldered by directing the flowing solder between guide means spaced apart horizontally a distance corresponding to such predetermined width, and moving a plurality of printed circuit assemblies along a predetermined path positioned relative to the moving molten solder hump so that the peak portion of the solder hump engages an under portion of each assembly in substantially touching contact.

2. A method of applying molten solder to solderable portions of a prefabricated circuit assembly on a panel of insulating material wherein the solder contacts substantially the entire width of the panel including the solderable portions of the circuit assembly, said method comprising providing a body of molten solder in a molten solder container, producing an upward flow of clean molten solder from the interior of the solder in the container by rotating mechanical means about a substantially horizontal axis positioned entirely below the surface of the solder in the container at a speed of rotation which will raise the flowing solder to a hump formation which extends to a predetermined height above the surface of the solder that is not a part of the hump, confining the hump to a predetermined width corresponding to the width of a prefabricated circuit assembly to be soldered by directing the flowing molten solder between confining means which project above the normal surface of the solder in the container and are spaced apart horizontally a distance corresponding to such predetermined width, and providing continuous movement of a prefabricated circuit assembly in a predetermined path which traverses the solder hump so that the entire underportion of the assembly wipes across the hump of solder.

3. A method of applying molten solder to solderable portions of a prefabricated circuit assembly wherein the solder contacts substantially the entire width of the assembly including the solderable portions thereof, said method comprising providing a body of molten solder in a molten solder container, producing an upward flow of clean molten solder from the interior of the solder in the container by rotating mechanical pumping means positioned entirely below the surface of the solder in the container about a substantially horizontal axis, directing the flow of molten solder into a space bounded by confining means situated above said pumping means and spaced horizontally a predetermined distance corresponding to the width of the circuit assembly and which project upwardly above the normal surface of the solder in the container, controlling the speed of rotation of said mechanical pumping means so that the upward flow of molten solder produced thereby forms a raised hump of flowing molten solder which extends to a predetermined height above the surface of the solder that is not a part of the hump and which is limited by the confining means to a predetermined width corresponding to the width of a prefabricated circuit assembly to be soldered, and providing continuous movement of a prefabricated circuit assembly in a predetermined path which traverses the solder hump so that the peak portion of the solder hump engages the underportion of the assembly across its entire width as the assembly moves across the hump.

4. A soldering machine including in combination, a container having an opening at the top thereof and housing therein a quantity of molten solder, means for mechanically moving molten solder within the container in a manner to create a hump of moving molten solder at the opening in the top thereof and at a height above the surface of said solder in the container so as to accomplish soldering on a workpiece at said opening, said mechanical means including horizontally extending rotatable means wholly submerged in the solder in said container and having solder raising portions thereon in contact with the molten solder in the container, a driving mechanism for rotating said rotatable means and raising the molten solder upwardly to create said hump of molten solder in a position above said rotatable means and to a height such that the upper peak surface of the hump is spaced vertically from the rotatable means and extends essentially parallel of the axis of rotation of said horizontally extending rotatable means, means having parallel confining portions spaced apart horizontally and positioned above said rotatable means to receive the hump between the same for confining the upper peak surface of the hump to a width corresponding to the width of the portion to the solder in each workpiece, means for supporting said workpiece in a manner so that each workpiece is placed at the position of the molten solder hump with the latter engaging at least an underportion of said workpiece, and means for moving a workpiece along said supporting means.

5. A soldering machine including in combination, a container having an opening at the top thereof and housing a body of molten solder, rotatable mechanical means having a horizontal axis of rotation mounted within said container in a position wholly submerged beneath an upper level of the body of solder and including solder raising portions thereon in contact with clean scum-free solder in the interior of the molten solder body, means for rotating said rotatable means at a predetermined speed so as to raise a circulating mass of molten solder to a predetermined position above the solder level in the container and at the opening in the container, means having vertical confining portions spaced above said rotatable means projecting above the normal surface of the solder in said container, said confining portions being spaced apart horizontally a predetermined distance corresponding to the width of a workpiece to be soldered and effective to confine the solder in the circulating mass to a hump of said predetermined width which has a clean scum-free top surface, and means for continuously moving individual workpieces across the opening and into contact with the clean scum-free top surfaces of the solder hump.

6. An automatic soldering machine for applying molten solder to an underportion of printed circuit assemblies and including in combination, a container for housing a quantity of molten solder, a rotatable member having a horizontal axis of rotation entirely submerged below the molten solder in said container, said rotatable member including a series of angularly spaced blades arranged around the axis of rotation of said member and with transverse axes of such blades extending essentially radially with respect to said axis of rotation, said blade being adapted to produce a flow of molten solder through the radial spaces between the blade and through the solder above said blades to create a hump of molten solder extending across a portion of the surface of molten solder in said container and above the surface of the remainder of the molten solder, with the height of said hump being a function of the rotational speed of said rotatable member, means having confining portions situated above said blades and projecting above the normal surface of the solder in the container and spaced apart horizontally a distance corresponding to the width of a printed circuit assembly to be soldered for confining the hump of solder to such width, driving means for imparting rotational motion to said rotatable member, support means extending over said container past said hump in the molten solder therein to support a series of printed circuit panel assemblies in spaced away relation with the surface of molten solder in said container, and means for moving the series of printed circuit panels in succession along said support means so that the under portions only of the assemblies are contacted by the hump of molten solder.

7. An automatic soldering machine for soldering pieces of an assembly together including in combination, a crucible for housing a quantity of molten solder, a rotatable shaft extending horizontally across said crucible beneath the normal molten solder level therein, a driving mechanism coupled to said shaft for imparting rotational motion thereto, a series of axially extending angularly spaced blades supported on said shaft around the axis of rotation thereof wholly beneath the solder level in said crucible for engaging the molten solder in said crucible, said blades creating continuously moving solder quantity in a hump formation in the molten solder in said crucible upon rotation of said shaft with said hump extending across said crucible essentially parallel to the axis of rotation of said shaft, a conveyor system extending horizontally over said crucible in spaced away parallel relation with the surface of the molten solder therein and moving across said hump in a direction essentially at right angles to said axis of rotation to support assemblies thereon, a pair of vertical spaced-apart parallel guide plates situated in the crucible above said blades and at right angles to the direction of movement of the assemblies, said hump being adapted to rise to the respective upper edges of said plates, with a plurality of assemblies being adapted to be moved on said conveyor system over said respective upper edges of said guide plates, and with the underportions only of such assemblies being successively contacted by said solder hump.

References Cited in the file of this patent

UNITED STATES PATENTS

| | | |
|---|---|---|
| 316,896 | Hubel et al. | Apr. 28, 1885 |
| 2,387,736 | Bierman | Oct. 30, 1945 |
| 2,469,392 | Jones et al. | May 10, 1949 |
| 2,529,699 | Lach | Nov. 14, 1950 |
| 2,683,099 | Hahn | July 6, 1954 |
| 2,770,875 | Zimmerman | Nov. 20, 1956 |
| 2,771,050 | Zimmerman | Nov. 20, 1956 |
| 2,895,638 | Dvorak | July 21, 1959 |

FOREIGN PATENTS

| | | |
|---|---|---|
| 712,109 | Great Britain | July 21, 1954 |
| 798,454 | Great Britain | July 23, 1958 |